US010147683B2

United States Patent
Haefner et al.

(10) Patent No.: US 10,147,683 B2
(45) Date of Patent: Dec. 4, 2018

(54) METHOD AND APPARATUS THAT PROCESSES AN OPTOELECTRONIC COMPONENT

(71) Applicant: OSRAM Opto Semiconductors GmbH, Regensburg (DE)

(72) Inventors: Norbert Haefner, Lappersdorf (DE); Ulrich Frei, Obertraubling (DE); Stefan Groetsch, Badd Abbach/Lengfeld (DE); Kurt-Juergen Lang, Regen (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/024,180

(22) PCT Filed: Sep. 18, 2014

(86) PCT No.: PCT/EP2014/069884
§ 371 (c)(1),
(2) Date: Mar. 23, 2016

(87) PCT Pub. No.: WO2015/040108
PCT Pub. Date: Mar. 26, 2015

(65) Prior Publication Data
US 2016/0197044 A1   Jul. 7, 2016

(30) Foreign Application Priority Data

Sep. 23, 2013   (DE) .................. 10 2013 219 087

(51) Int. Cl.
*H01L 23/544* (2006.01)
*H01L 25/075* (2006.01)
(Continued)

(52) U.S. Cl.
CPC .......... *H01L 23/544* (2013.01); *G01B 11/272* (2013.01); *H01L 21/67259* (2013.01);
(Continued)

(58) Field of Classification Search
None
See application file for complete search history.

(56) References Cited

U.S. PATENT DOCUMENTS 2,423,513 A * 7/1947 Meyer .................... G01C 21/22
                                                  33/17 R
2007/0064233 A1* 3/2007 Takagi .................. G03F 9/7049
                                                  356/401
(Continued)

FOREIGN PATENT DOCUMENTS

CN     100539214       9/2009
DE     102 33 190 A1   2/2004
(Continued)

OTHER PUBLICATIONS

First Office Action dated Sep. 29, 2017, of corresponding Chinese Application No. 201480063906.6 in English.

*Primary Examiner* — Long Pham
(74) *Attorney, Agent, or Firm* — DLA Piper LLP (US)

(57) ABSTRACT

A method of processing an optoelectronic component includes a light source having at least one luminous area formed by one or a plurality of light emitting diodes and a receptacle device that receives the light source, including determining a deviation of an actual position of the light source at the receptacle device from a desired position of the light source at the receptacle device, and forming at least one marking at the receptacle device that indicates the deviation.

15 Claims, 11 Drawing Sheets

(51) Int. Cl.
  *H01L 33/00* (2010.01)
  *G01B 11/27* (2006.01)
  *H01L 21/67* (2006.01)
  *H01L 21/66* (2006.01)
  *H01L 33/48* (2010.01)

(52) U.S. Cl.
  CPC .......... *H01L 22/12* (2013.01); *H01L 25/0753* (2013.01); *H01L 33/0095* (2013.01); *H01L 33/483* (2013.01); *H01L 33/486* (2013.01); *H01L 2223/54413* (2013.01); *H01L 2924/0002* (2013.01); *H01L 2933/0033* (2013.01)

(56) References Cited

U.S. PATENT DOCUMENTS

| | | |
|---|---|---|
| 2009/0251918 A1 | 10/2009 | Engl et al. |
| 2010/0053929 A1 | 3/2010 | Bisberg |
| 2012/0056217 A1 | 3/2012 | Jung et al. |
| 2012/0074438 A1 | 3/2012 | Hwang et al. |
| 2014/0109785 A1* | 4/2014 | Pauliac ............ B82Y 10/00 101/450.1 |
| 2015/0211843 A1 | 7/2015 | Petsch |
| 2016/0011224 A1* | 1/2016 | Pollack ............ G01N 35/04 700/230 |
| 2017/0072732 A1* | 3/2017 | Batistatos ............ B41M 3/14 |

FOREIGN PATENT DOCUMENTS

| | | |
|---|---|---|
| DE | 10 2004 036 990 A1 | 3/2006 |
| DE | 10 2004 056 252 A1 | 5/2006 |
| DE | 11 2010 002 822 T5 | 6/2012 |
| EP | 1 528 602 A1 | 5/2005 |
| JP | 06-188458 | 7/1994 |
| JP | 2001-1183551 | 7/2001 |
| JP | 2012-15176 A | 1/2012 |
| WO | 2009/067985 A1 | 6/2009 |
| WO | 2014/028954 A1 | 2/2014 |

\* cited by examiner

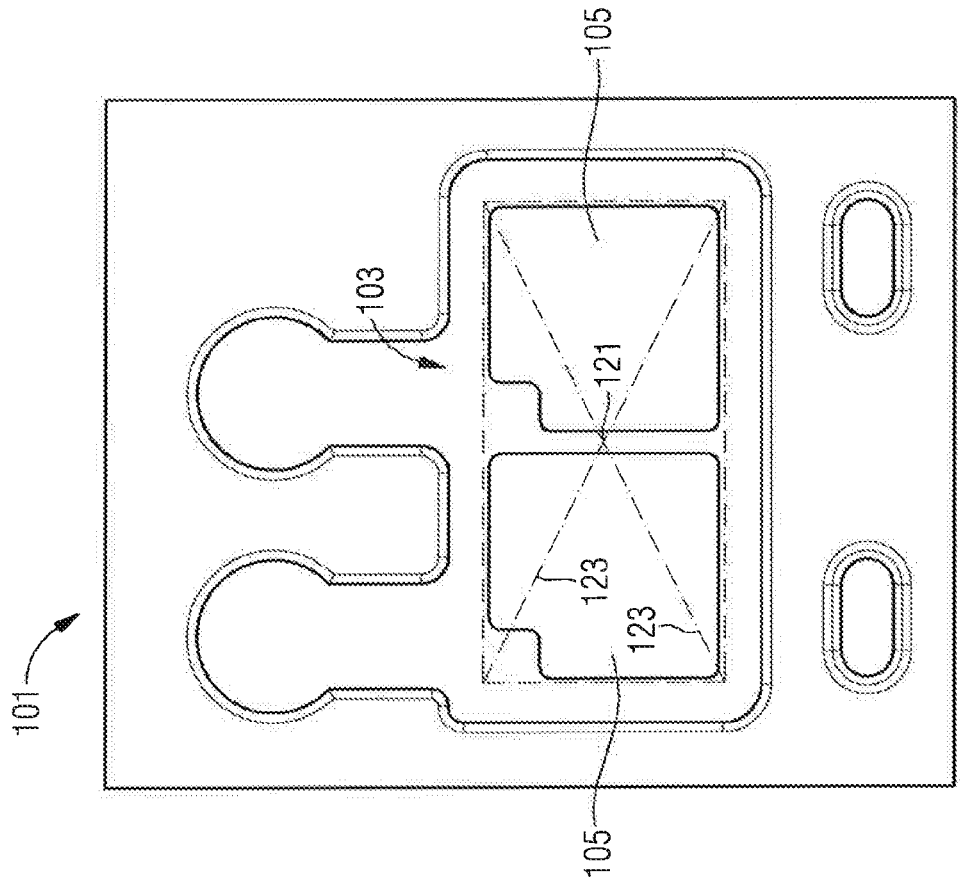
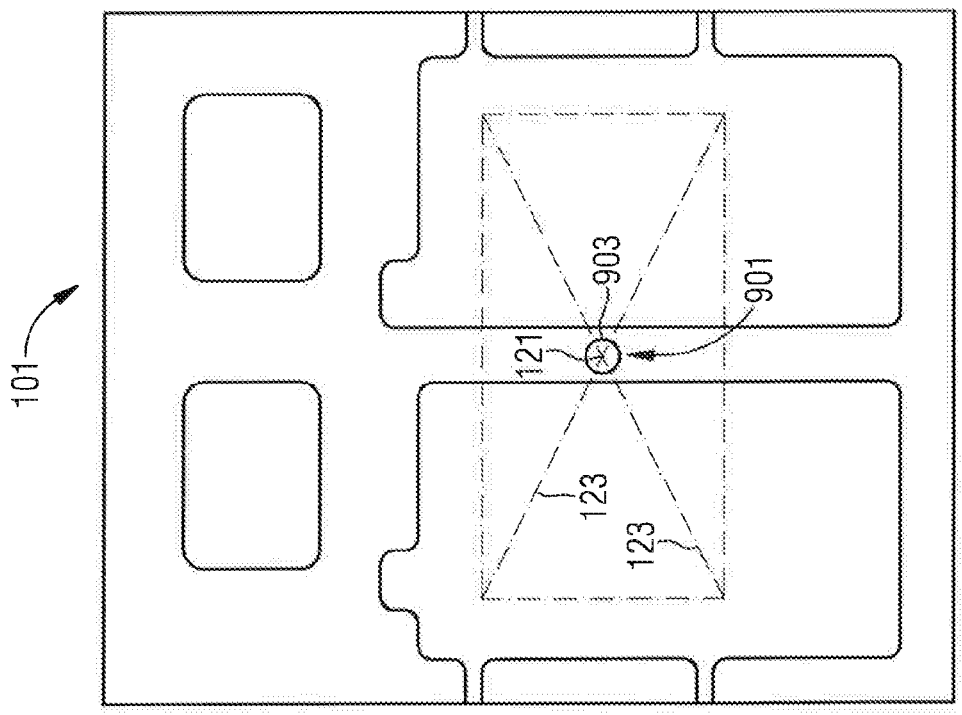
FIG 10A
FIG 10B

METHOD AND APPARATUS THAT PROCESSES AN OPTOELECTRONIC COMPONENT

TECHNICAL FIELD

This disclosure relates to a method and an apparatus that processes an optoelectronic component, an optoelectronic component, a method and an apparatus that equips a carrier and a computer program.

BACKGROUND

Optoelectronic components generally comprise a plurality of light emitting diodes arranged in a housing. When the optoelectronic component is incorporated into an optical system, for example, a fog lamp or a low-beam light, it is important for the light emitting diodes to be arranged in an exactly known desired position within the housing. A deviation from the desired position in the incorporated state can generally have the effect that optical properties of the optical system are reduced. In this regard, by way of example, a beam path demanded by the optical system can no longer be complied with due to the deviation.

Such an optical system is generally a reject or has to be readjusted in a costly manner.

It is therefore desirable to identify a possible deviation before an optoelectronic component is incorporated into an optical system, and to make this information available for further process steps.

It could therefore be helpful to provide a method of processing an optoelectronic component that accounts for a possible deviation of an actual position of a light source of the optoelectronic component from a desired position before the optoelectronic component is incorporated into an optical system, with the result that costly readjustment steps can be avoided.

SUMMARY

We provide a method of processing an optoelectronic component including a light source having at least one luminous area formed by one or a plurality of light emitting diodes and a receptacle device that receives the light source, including determining a deviation of an actual position of the light source at the receptacle device from a desired position of the light source at the receptacle device, and forming at least one marking at the receptacle device that indicates the deviation.

We also provide an apparatus that processes an optoelectronic component including a light source having at least one luminous area formed by one or a plurality of light emitting diodes, and a receptacle device that receives the light source, including a deviation determining device that determines a deviation of an actual position of the light source at the receptacle device from a desired position of the light source at the receptacle device, a marking device that forms a marking at the receptacle device, and a controller that controls the marking device depending on the determined deviation to form at least one marking at the receptacle device that indicates the deviation.

We also provide an optoelectronic component including a light source having at least one luminous area formed by one or a plurality of light emitting diodes, and a receptacle device that receives the light source, wherein the receptacle device has a marking that indicates a deviation of an actual position of the light source at the receptacle device from a desired position of the light source at the receptacle device.

We further provide a method of equipping a carrier with an optoelectronic component including providing a carrier with a first receptacle position to receive the optoelectronic component, detecting the marking to determine the deviation, and arranging the component on the carrier in a second receptacle position chosen depending on the determined deviation relative to the first receptacle position.

We yet further provide an apparatus that equips a carrier with an optoelectronic component including a providing device that provides a carrier with a first receptacle position to receive the optoelectronic component, a detecting device that detects the marking to determine the deviation, an arranging device that arranges the component on the carrier, and a controller that controls the arranging device, wherein the controller controls the arranging device depending on the determined deviation such that the arranging device arranges the optoelectronic component in a second receptacle position chosen depending on the determined deviation relative to the first receptacle position.

We still further provide a computer program including program code that carries out the method when the computer program is executed in a computer.

BRIEF DESCRIPTION OF THE DRAWINGS

FIGS. 1 to 4A and 4B and to 10A and 10B show an optoelectronic component.

LIST OF REFERENCE SIGNS

Figure 1:
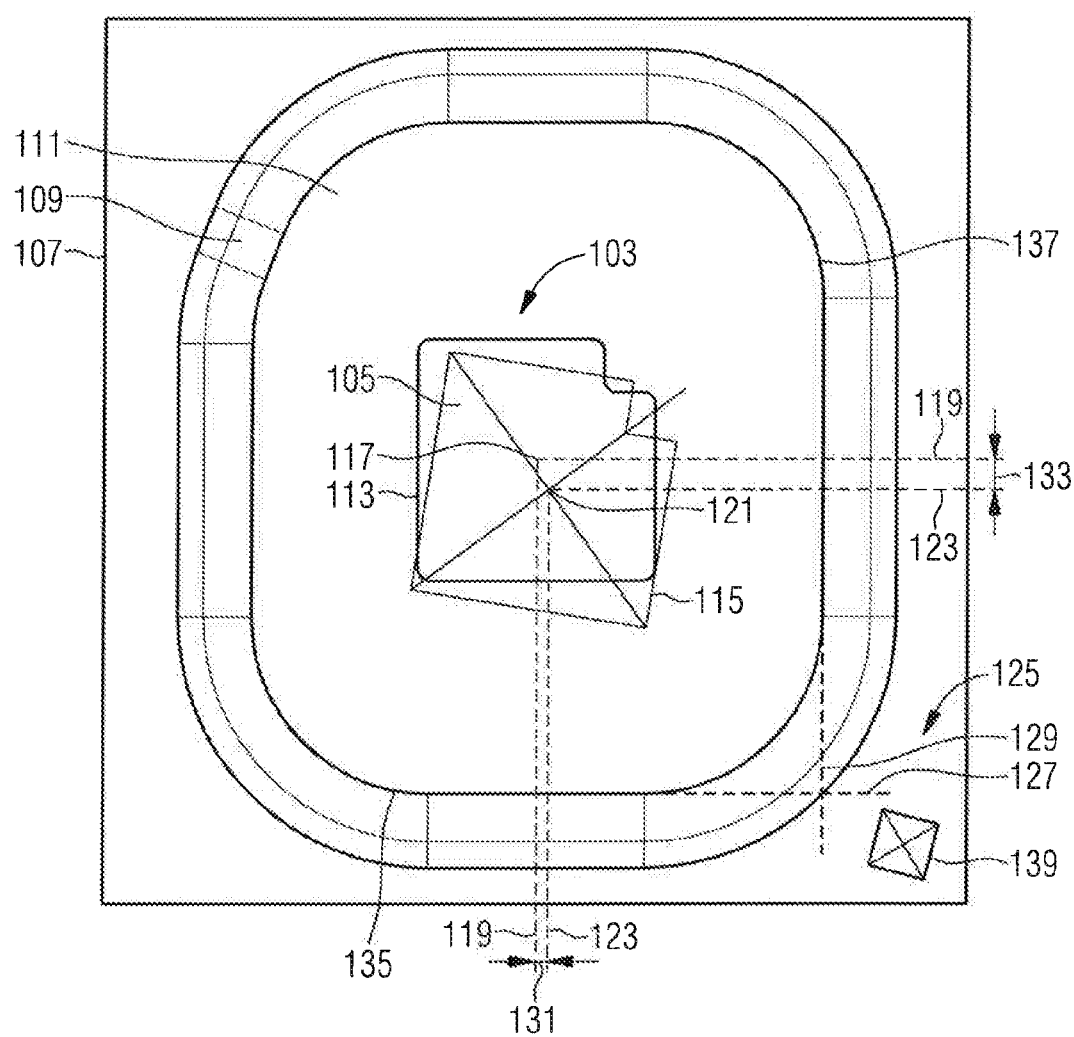

101 Optoelectronic component
103 Light source
105 Luminous area
107 Receptacle device
109 Housing
111 Transparent region
113 Desired position
115 Actual position
117 Optical center of the desired position
119 Intersecting lines whose point of intersection is the optical center of the desired position
121 Optical center of the actual position
123 Intersecting lines whose point of intersection is the optical center of the actual position
125 Reference co-ordinate system
127 Abscissa or x-axis of the reference co-ordinate system
129 Ordinate or y-axis of the reference co-ordinate system
131 Deviation in the x-direction
133 Deviation in the y-direction
135, 137 Inner edges
139 Marking
201, 203 Outer edges
301, 303 Cutouts
305 Edge of the cutouts
401, 403 Holes in the cutouts
601, 603 Edges
701 Deviation of the marking relative to the x-axis 801 Square
803 Midpoint of the square
805a Perpendicular upon alignment of the square parallel to the outer edges 201, 203
805b Perpendicular
807 Angle
901 Actual marking
903 Luminous marking
1101 Determining a deviation
1103 Forming at least one marking
1201 Apparatus for processing an optoelectronic component
1203 Deviation determining device
1205 Marking device
1207 Controller of the apparatus 1201
1301 Providing a carrier
1303 Detecting the marking
1305 Choosing a second receptacle position
1307 Arranging the component on the carrier in the second receptacle position
1401 Apparatus for equipping a carrier
1403 Providing device
1405 Detecting device
1407 Arranging device
1409 Controller of the apparatus 1401

DETAILED DESCRIPTION

We provide a method of processing an optoelectronic component that may comprise a light source having at least one luminous area formed by one or a plurality of light emitting diodes and a receptacle device that receives the light source that may comprise:

determining a deviation of an actual position of the light source at the receptacle device from a desired position of the light source at the receptacle device, and forming at least one marking at the receptacle device which indicates the deviation.

Our apparatus for processing an optoelectronic component comprising a light source having at least one luminous area formed by one or a plurality of light emitting diodes, and a receptacle device that receives the light source may comprise:

a deviation determining device that determines a deviation of an actual position of the light source at the receptacle device from a desired position of the light source at the receptacle device, a marking device that forms a marking at the receptacle device, and a controller that controls the marking device depending on the determined deviation to form at least one marking at the receptacle device that indicates the deviation.

Our optoelectronic component may comprise:

a light source having at least one luminous area formed by one or a plurality of light emitting diodes, and a receptacle device that receives the light source, wherein the receptacle device has a marking that indicates a deviation of an actual position of the light source at the receptacle device from a desired position of the light source at the receptacle device.

Our method of equipping a carrier with the optoelectronic component may comprise:

providing a carrier with a first receptacle position to receive the optoelectronic component, detecting the marking to determine the deviation, and arranging the component on the carrier in a second receptacle position chosen depending on the determined deviation relative to the first receptacle position.

Our apparatus for equipping a carrier with the optoelectronic component may comprise:

a providing device that provides a carrier with a first receptacle position to receive the optoelectronic component, a detecting device that detects the marking to determine the deviation, an arranging device that arranges the component on the carrier, and a controller that controls the arranging device, wherein the controller controls the arranging device depending on the determined deviation such that the arranging device arranges the optoelectronic component in a second receptacle position chosen depending on the determined deviation relative to the first receptacle position.

Our computer program may comprise program code that carries out the method of processing an optoelectronic component and/or equipping a carrier with an optoelectronic component if the computer program is executed in a computer, preferably in a controller.

Features in association with the apparatus analogously apply to the methods, and vice versa.

We ascertain to what extent the actual position of the light source deviates from the desired position. This information is then attached to the receptacle device by the marking such that this information can be read out at any time later on. Consequently, before the optoelectronic component is incorporated into an arbitrary optical system, it is thus advantageously known whether and, if so, to what extent there is a deviation between the actual position and the desired position of the light source at the receptacle device. Correspondingly, adequate steps that take account of and compensate for a possible deviation can then be carried out. A costly readjustment of an optoelectronic component incorporated in an optical system is thus advantageously obviated. Even optoelectronic components having a considerable deviation can continue to be used and thus do not form rejects.

In this regard, therefore, particularly when the component is arranged on the carrier, the fact that a deviation is present is taken into account. This is particularly by virtue of the fact that the component is not arranged in the first receptacle position originally provided, but rather in a second receptacle position. The second receptacle position for the optoelectronic component takes account of the deviation in so far as the second receptacle position relative to the first receptacle position is chosen depending on the determined deviation.

That is to say therefore, in particular, that a position of the marking is read by the detecting device, an offset of the optoelectronic component on the carrier being correspondingly corrected.

If, therefore, by way of example, the light source is arranged at a specific distance to the left of the actual desired position, then the second receptacle position is chosen such that the latter is formed in a manner having this distance to the right of the first receptacle position. Simple and efficient compensation of a possible deviation is therefore made possible as a result.

The carrier may be formed as an electronic circuit carrier.

A plurality of luminous areas may be provided. The luminous areas can be formed, for example, identically or in particular differently.

A plurality of light emitting diodes may be provided for forming a luminous area. The diodes can be formed, for example, identically or preferably differently.

An optical center of the luminous area may be determined and the marking may indicate the deviation of the actual position of the optical center with respect to the desired position of the optical center.

That is to say therefore, in particular, that a position of the optical center or of the area to be luminous is determined. This is done in particular by a measuring instrument. By way of example, such a measuring instrument can comprise a camera, in particular a luminance camera. The optical center can also be referred to as an optical centroid by analogy with a geometrical centroid. That is to say therefore, in particular, that the optical center is a combination of the luminous flux at one point. In optics, the term "optical center" is used for the center of the lens. In a luminous area, the term is used to denote the midpoint or centroid. By way of example, the optical center corresponds to that position or that location of the luminous area having the highest luminance or intensity. In particular, the optical center can correspond to the geometrical center, that is to say the centroid. The geometrical center is generally the midpoint of the luminous area.

The fact that the optical center is used to determine a deviation advantageously enables the deviation to be determined particularly simply. This is because such an optical center can be determined particularly simply by optical image recognition methods.

A reference co-ordinate system may be determined at the receptacle device and the marking indicates the deviation of the actual position with respect to the desired position relative to the reference co-ordinate system. The use of a reference co-ordinate system situated at the receptacle device enables at any time a statement about where the light source is situated relative to the desired position, without additional adjustment having to be used for this purpose. This would not be possible, for example, if a coordinate system situated outside the optoelectronic component, that is to say externally relative thereto, were chosen as the reference co-ordinate system.

At least one physical feature of the receptacle device may be detected as a reference feature used to determine the reference co-ordinate system.

The fact that an already present physical feature of the receptacle device is used as a reference feature to determine the reference co-ordinate system advantageously has the effect that it is possible to dispense with additional means to determine the reference co-ordinate system which otherwise would also additionally have to be attached to the receptacle device. The idea, therefore, is that physically striking features of the receptacle device form at least parts of the reference co-ordinate system. In particular, such a reference co-ordinate system can be aligned on the physical feature. By way of example, an axis of the reference co-ordinate system can be aligned on the physical feature.

A plurality of physical features of the receptacle device can be detected as reference features used to determine the reference co-ordinate system. The corresponding explanations in association with one physical feature analogously also apply to a plurality of physical features, and vice versa. The plurality of physical features can be formed in particular identically or, for example, differently.

Explanations in association with the alignment of one coordinate axis analogously apply to alignment of a plurality of coordinate axes of the reference co-ordinate system, and vice versa.

The receptacle device may have a housing as a physical feature, the light source being arranged in the housing, wherein a housing edge is detected for the purpose of determining a coordinate axis of the reference co-ordinate system such that the coordinate axis runs at least partly along the housing edge.

That is to say therefore, in particular, that a housing edge is used as a coordinate axis or that at least one coordinate axis of the reference co-ordinate system is aligned on the housing edge. In particular, a plurality of housing edges can be used to align coordinate axes thereon or align the coordinate system such that the coordinate axes thereof run at least partly along the housing edges. The use of housing edges in association with a camera system is a particularly reliable possibility to detect striking physical features. This is because housing edges generally have a particularly good contrast in camera images. This makes it possible that image recognition methods can detect the housing edges in the camera images particularly reliably.

The physical feature may be at least one feature selected from the following group of physical features: inner edge of a housing, outer edge of a housing, holding-down device cutout, housing cutout and cutout in the receptacle device.

A holding-down device holds down in particular a carrier, in particular a metal carrier, on which the light source is arranged, for example, adhesively bonded thereon and/or soldered thereon, in a correct or right or wanted position. This takes place in particular during an injecting process in an injection molding method of forming or molding a housing of the receptacle device. For this purpose, in particular the carrier, in particular the metal carrier, with the light source is introduced into a mold for high-pressure injection molding and is encapsulated with plastic, for example, to mold the housing. The carrier is held down at predetermined intervals by holding-down devices in the correct position so that it is not warped during the injecting process. At the locations at which the holding-down device holds down the carrier, there is no plastic in the housing, and a cutout forms at these locations. These locations can thus be referred to, in particular, as a holding-down device cutout.

The idea behind this is, in particular, that an element of the component having a good contrast in a camera image and can therefore be readily identified or detected in such a camera image by image recognition methods to determine, align or define the reference co-ordinate system or the axes thereof.

The receptacle device may have a cutout as a physical feature, wherein an edge of the cutout is detected for the purpose of determining a coordinate axis of the reference co-ordinate system such that the coordinate axis runs at least partly along the edge. For example, the coordinate axis can be formed as a tangent at a point or in a location of the edge.

Such a cutout can be a holding-down device cutout, for example. For example, the coordinate axis can run as a tangent at a point of the edge of the cutout.

Use of a cutout to determine a coordinate axis of the reference co-ordinate system enables the reference co-ordinate system to be determined simply and efficiently and reliably. This is because such cutouts are particularly simple to detect. This is done in particular by a camera and a corresponding image recognition method.

The cutout may have a hole, wherein the coordinate axis runs at least partly along an edge or a contour of the hole. By way of example, the coordinate axis can be formed as a tangent at a location of the edge of the hole.

The receptacle device may have a housing, the light source being arranged in the housing, wherein the marking is applied on a housing outer side facing away from the light source.

What can advantageously be brought about as a result is that the marking is no longer visible when the optoelectronic component is incorporated in an optical system. An optical appearance might otherwise be impaired.

The marking may be applied on a housing top side formed in the beam direction. This can advantageously have the effect that even after the optoelectronic component is incorporated into an optical system, the information regarding the deviation is present and can thus be read out.

A possible impediment of an optical appearance can generally be accepted here.

The marking may be implemented at the receptacle device by notching and/or drilling and/or embossing and/or laser treatment.

That is to say, therefore, in particular that the marking device can comprise a drill, a device that applies or introduces a notch and/or an embossing device, for example, a stamp, to apply or attach an embossing. In particular, the marking device can comprise a laser. In this respect, for example, the marking can be implemented at the receptacle device by laser treatment or arranged or attached by the laser. By way of example, the marking can be a hole implemented by drilling and/or laser treatment, for example.

The marking may be formed as a barcode. The barcode can be formed as a two-dimensional (2D) barcode, for example. In particular, the barcode can be formed as a QR barcode.

Since a barcode can generally be read simply and reliably, an effective means of indicating the deviation is provided thereby. This is the case, in particular, even if the barcode is partly damaged. Consequently, a corresponding equipping method is particularly reliable and robust regarding damage to the marking. That is to say, therefore, in particular that the second receptacle position can be correctly determined or chosen even in a damaged marking.

The marking may be a geometrical symbol. For example, a rectangle, a rhombus, a circle, a ring or a square can be chosen as the geometrical symbol.

The marking may be a sequence of letters and/or numbers. Such a sequence of letters and/or numbers can advantageously be used as coding to the effect of where exactly the light source is situated relative to the desired position.

A plurality of markings can be provided. The markings can be formed in particular identically or, for example, differently.

Prior to determining the deviation, the actual position may be identified by an actual marking at the receptacle device.

That is to say, therefore, in particular that an optoelectronic component as such is provided or disclosed having an actual marking that indicates the actual position of the light source.

Therefore, an actual marking indicating the actual position of the light source is provided at the receptacle device. The actual position can correspond, for example, to the actual position of the optical center.

Provision of such an actual marking advantageously makes it particularly simple to determine the deviation.

The actual marking may be formed as a luminous marking designed to emit electromagnetic radiation upon excitation by electromagnetic radiation having a first wavelength, wherein the first wavelength differs from a second wavelength of electromagnetic radiation that can be emitted during operation by the light emitting diode.

That is to say, therefore, in particular that the light source emits electromagnetic radiation comprising a wavelength differing from a wavelength of electromagnetic radiation emitted by the excited luminous marking. As a result, therefore, advantageously the light source of the optoelectronic component can no longer excite the luminous marking to emit electromagnetic radiation. That is to say, therefore, in particular that the luminous marking is not visible or is only poorly visible during operation of the optoelectronic component since the luminous marking no longer emits electromagnetic radiation.

By way of example, the luminous marking can comprise a phosphorescent material. The phosphorescent material can be referred to, for example, generally as a phosphor. The luminous marking can have, for example, a geometrical shape analogous to the geometric symbols mentioned above. By way of example, the luminous marking can have a sequence of letters and/or numbers.

In this regard, for example, a blue (460 nm to 480 nm) LED can comprise a converter medium, in particular a phosphor, for example, a yellow (565 nm to 575 nm) phosphor, in particular a phosphor lamina to generate white light. To identify the optical center, a luminous marking is arranged or positioned or formed onto the converter medium, for example, the yellow phosphor lamina, by a specific amount of phosphor, for example, a drop that can be excited to emit light only by, for example, green (520 nm to 565 nm) light or UV light (100 nm to 380 nm). If the blue LED is luminous during operation, its emitted radiation does not excite the luminous marking comprising the green or UV phosphor.

A phosphor is, in particular, a mixture comprising different substances that can be excited by light to emit light.

As a result of directly identifying the actual position, in particular the actual position of the optical center, the deviation can be determined by an identification by optical measuring devices, for example, a camera in particular a video camera. There is no need for unambiguous geometrical edges at the receptacle device. That is to say, therefore, in particular that the actual marking can be identified by a camera or a camera system. This is done particularly when checking a suction attachment position of the optoelectronic component in the context of arranging the component on a carrier.

The above-described properties, features and advantages and the way in which they are achieved will become clearer and more clearly understood in association with the following description of the examples explained in greater detail in association with the drawings.

Hereinafter, identical reference signs may be used for identical features. Furthermore, not all reference signs for all elements are contained in all drawings, for the sake of clarity.

FIG. 1 shows an optoelectronic component 101.

The optoelectronic component 101 comprises a light source 103. The light source 103 has a luminous area 105. The luminous area 105 is formed by a light emitting diode. The light emitting diode is not shown for the sake of clarity.

In an example not shown, a plurality of luminous areas may be provided. In a further example not shown, a plurality of light emitting diodes may be provided to form a luminous area.

Furthermore, the optoelectronic component 101 comprises a receptacle device 107 that receives the light source 103. The receptacle device 107 has a housing 109 in which the light source 103 is arranged. The housing 109 has a transparent region 111 as seen from above in a plan view such that light emitted by the light source 103 can radiate toward the outside through the housing 109. The transparent region 111 can be formed by glass or some other transparent material, for example. The transparent region 111 can be formed, for example, by a reflective potting compound that can advantageously increase a light emission. In particular, the transparent region 111 can be formed by a clear potting. The transparent region 111 can generally be formed in particular from a reflective or optically clear material.

The transparent region 111 can be arranged as a separate element on the housing 109 after completion of the latter. However, since the transparent region 111 ultimately forms a unit with the housing 109 after completion of the optoelectronic component 101, the transparent region 111 can be defined as being associated with the housing 109.

A desired position of the light source 103 is identified by the reference sign 113. An actual position of the light source 103 is identified by the reference sign 115.

An optical center of the desired position 113 is identified by the reference sign 117. Intersecting lines whose point of intersection is the optical center 117 of the desired position 113 are identified by the reference sign 119.

An optical center of the actual position 115 is identified by the reference sign 121. Intersecting lines whose point of intersection is the optical center 121 of the actual position 115 are identified by the reference sign 123.

To define or indicate a deviation of the actual position 115 from the desired position 113, a reference co-ordinate system 125 is formed.

The reference co-ordinate system 125 has an abscissa 127 or x-axis. The reference co-ordinate system 125 furthermore has an ordinate 129 or y-axis.

A deviation of the actual position 115 relative to the desired position 113 in the x-direction is identified by the reference sign 131. A corresponding deviation in the y-direction is identified by the reference sign 133.

In this case, the two axes 127 and 129 of the reference co-ordinate system 125 run along inner edges 135, 137 of the housing 109. In the example shown in FIG. 1, the inner edges 135, 137 run along an edge of the transparent region 111. In this regard, for example, the axes 127, 129 of the reference co-ordinate system 125 can run at edges of a glass cover of the transparent region 111.

Such edges have a sufficiently high contrast in a camera or video image such that the edges can be detected by suitable image recognition methods. It is thus possible simply and reliably to define axes for a reference co-ordinate system by a camera, in particular a video camera.

The deviation of the actual position 115 with respect to the desired position 113 is indicated by a marking 139 attached to the housing 109. In this case, the marking 139 is arranged in an offset manner relative to its midpoint in a manner offset with respect to the origin of the reference co-ordinate system 125, that is to say the point of intersection of the x-axis 127 and the y-axis 129, according to the deviation 131 in the x-direction and the deviation 133 in the y-direction. It can thus be recognized clearly and directly that the optical center 121 of the actual position 115 situated on the right underneath relative to the optical center 117 of the desired position 113.

Figure 2:
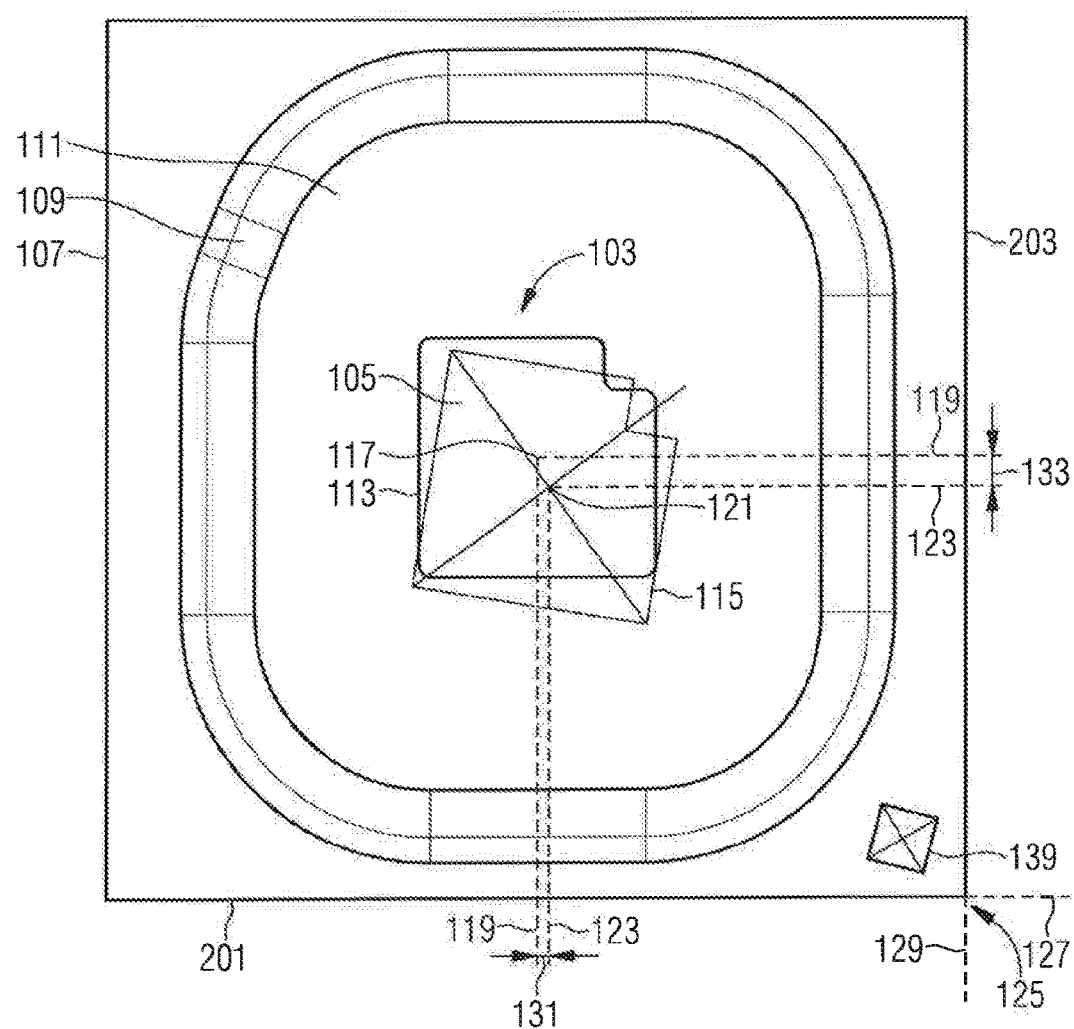

FIG. 2 shows a further optoelectronic component 101.

In the example shown in FIG. 2, outer edges 201, 203 of the housing 109 are used to define the two axes 127, 129 of the reference co-ordinate system 125. In the example shown in FIG. 2, the housing 109 has a rectangular shape. Consequently, the axes 127, 129 of the reference co-ordinate system 125 can run along two mutually perpendicular edges of the rectangle of the housing 109.

In the example shown in FIG. 2, the origin of the reference co-ordinate system 125 lies in a corner of the rectangle of the housing 109. The marking 139 is correspondingly arranged in a manner offset with respect to the origin.

Arbitrary definitions or rules can be established to the effect of how in concrete terms specifically the position of the marking 139 relative to the reference co-ordinate system 125 indicates the corresponding deviation of the actual position 115 from the desired position 113. In this regard, by way of example, an offset of the marking 139 or a distance with respect to the x-axis 127 of 3 mm can indicate that the deviation 131 in the x-direction can be larger or smaller by a factor of 2. Arbitrary transformation rules can therefore be defined here to deduce the deviation from the position of the marking 139 relative to the reference co-ordinate system 125.

Figure 3:
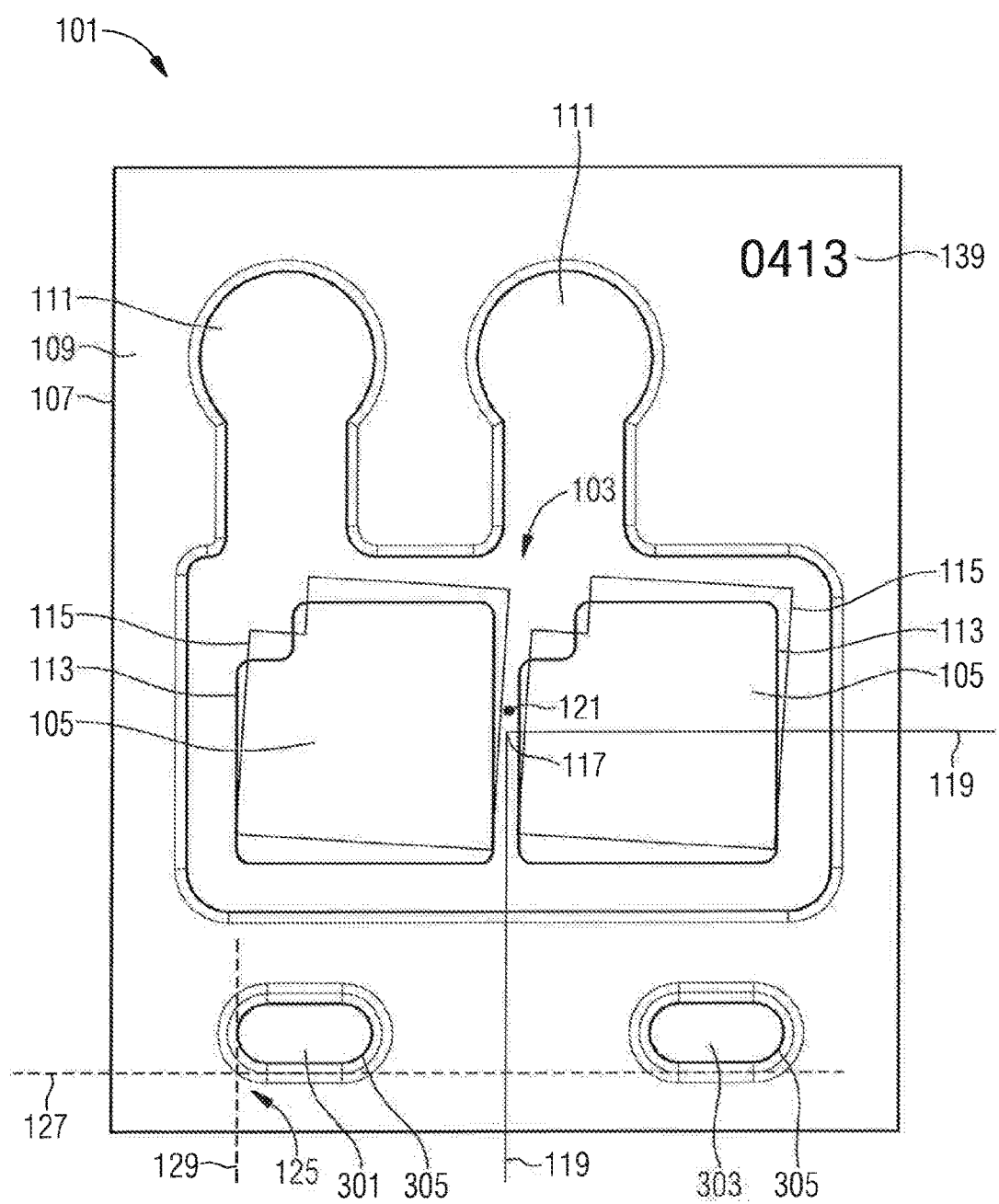

FIG. 3 shows a further optoelectronic component 101.

The optoelectronic component 101 in accordance with FIG. 3 has two luminous areas 105, each deviating from their desired position 113.

Two cutouts 301 and 303 are formed in the housing 109 of the optoelectronic component 101 in accordance with FIG. 3. The cutouts each have an edge 305. The two axes 127, 129 of the reference co-ordinate system 125 are chosen such that they run at least partly along the edge 305.

The marking 139 of the optoelectronic component 101 in accordance with FIG. 3 is formed as a numerical sequence indicating an offset of the optical center 121 of the actual position 115 with respect to the optical center 117 of the desired position 113 relative to the reference co-ordinate system 125. The numerical sequence can be an arbitrarily defined code which codes the corresponding offset.

In the example shown in FIG. 3, the marking 139 is attached to a top side of the housing.

Figure 4A:
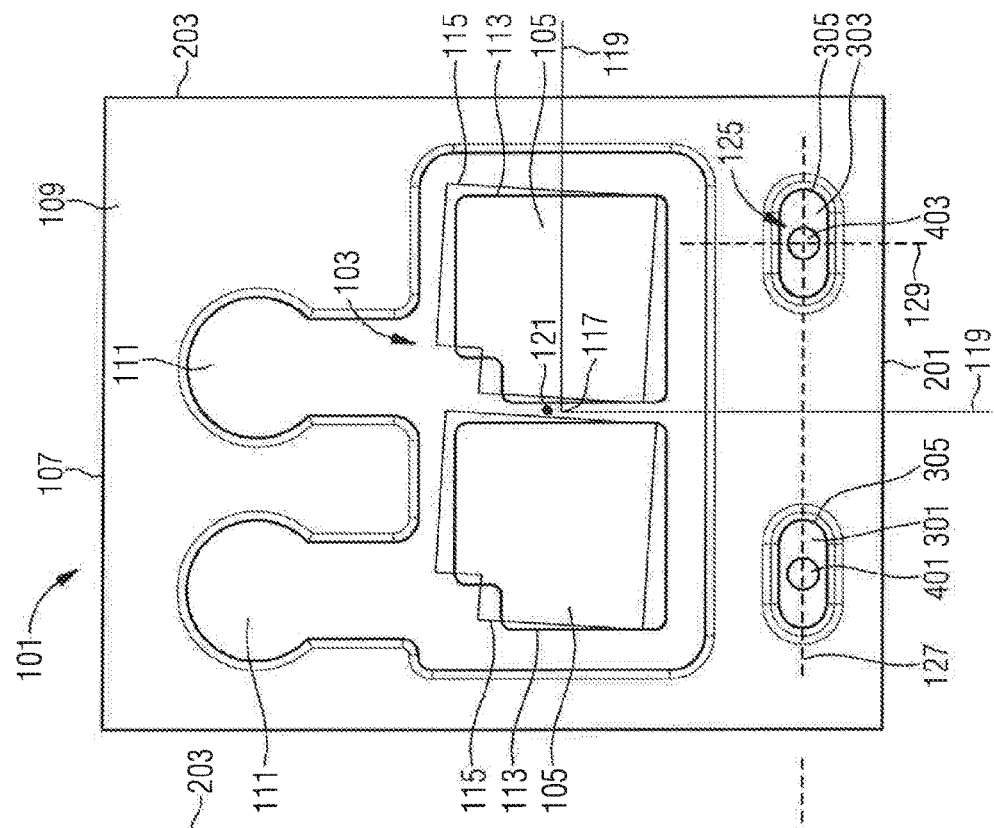
Figure 4B:
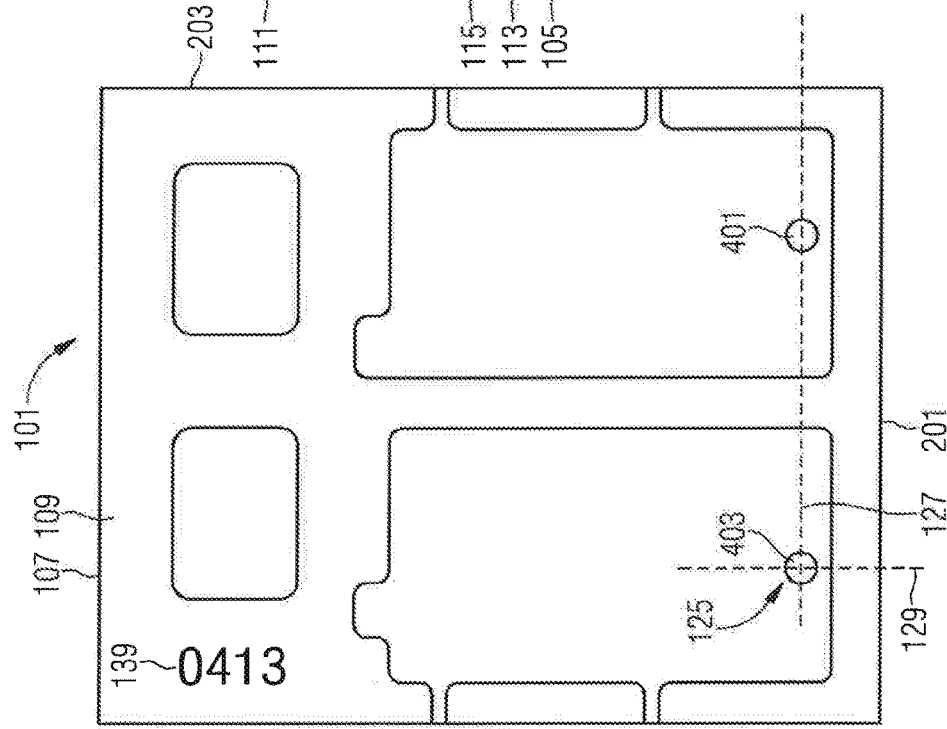

In contrast thereto, in the optoelectronic component 101 in accordance with FIGS. 4A and 4B, the marking 139 is arranged on an underside of the housing facing away from the light source 103. The underside of the housing can be referred to as a rear side of the housing.

The view in accordance with FIG. 4A shows the rear side of the housing, that is to say the optoelectronic component 101 from below. FIG. 4B shows the optoelectronic component 101 in a plan view from above.

As a further difference with respect to the example in accordance with FIG. 3, in the optoelectronic component 101 in accordance with FIGS. 4A and 4B, holes 401, 403 are provided in the cutouts 301, 303. The midpoint of the holes 401, 403 can be used as an origin for the reference co-ordinate system 125. In this case, in concrete terms in FIGS. 4A and 4B the origin has been placed into the right-hand hole 403. The x-axis 127 runs parallel to the outer edge 201 and in this respect also runs through the midpoint of the left-hand hole 401. The y-axis 129 is then provided perpendicular to the x-axis 127 and in this respect runs parallel to the outer edge 203.

Figure 5:
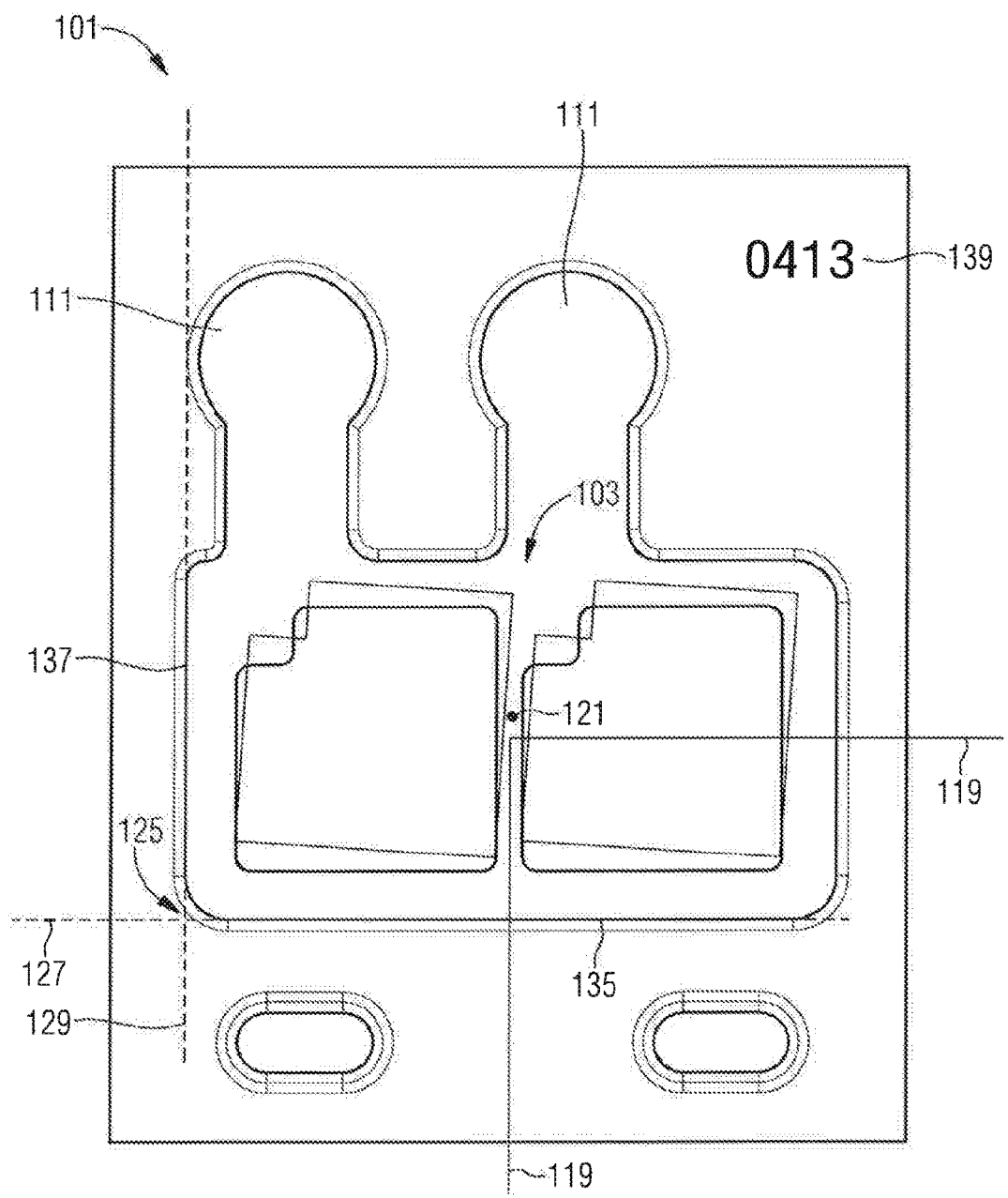

FIG. 5 shows a further optoelectronic component 101.

The optoelectronic component 101 in accordance with FIG. 5 is constructed substantially analogously to the optoelectronic component 101 in accordance with FIG. 3. As a difference, the axes 127, 129 of the reference co-ordinate system 125 of the optoelectronic component 101 in accordance with FIG. 5 run along inner edges 135, 137 of the housing 109. The marking 139 is formed as a numerical sequence analogously to FIG. 3.

Figure 6:
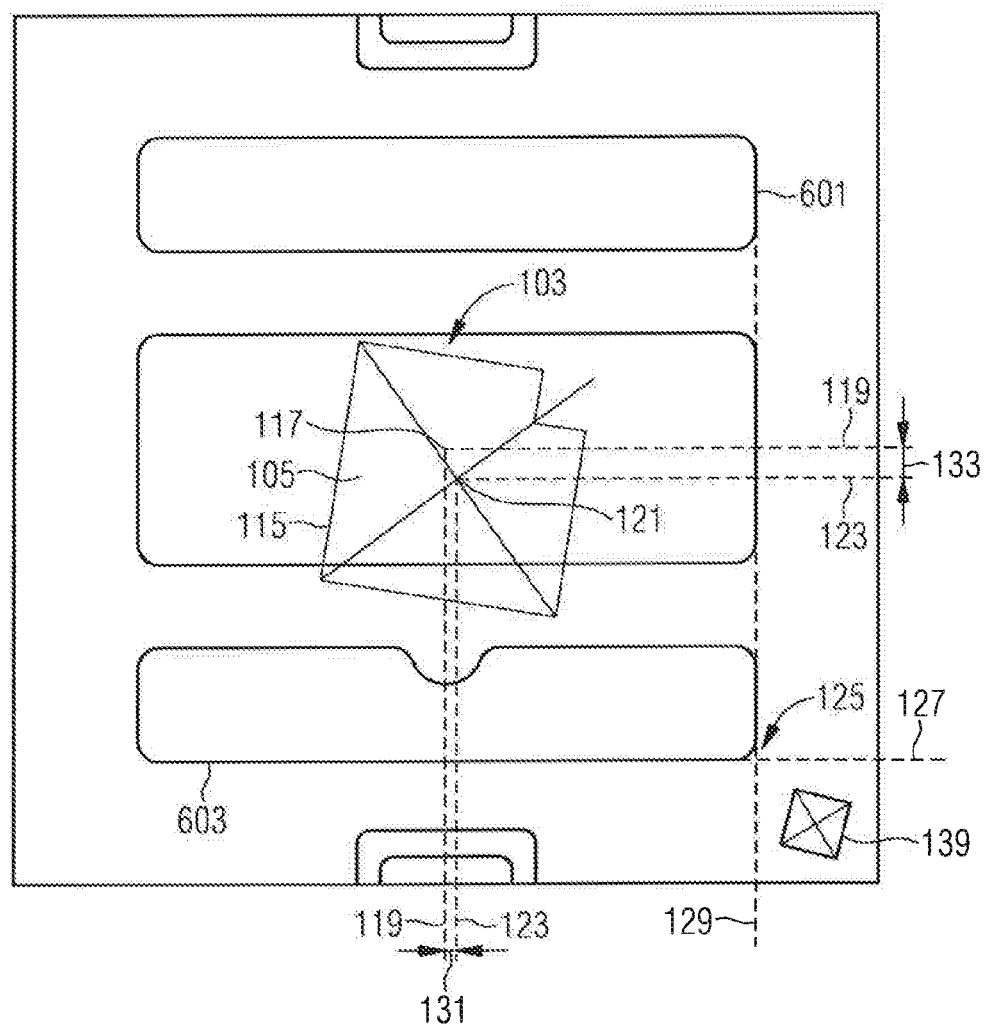

FIG. 6 shows another optoelectronic component 101.

In this case, prominent edges 601, 603 of the component 101 are used to define the course of the two axes 127, 129 of the reference co-ordinate system 125. Such edges 601, 603 can be formed in particular along an inner contour of the component 101. An inner contour denotes, in particular, a contour of arbitrary visible structural elements of the component 101.

Figure 7:
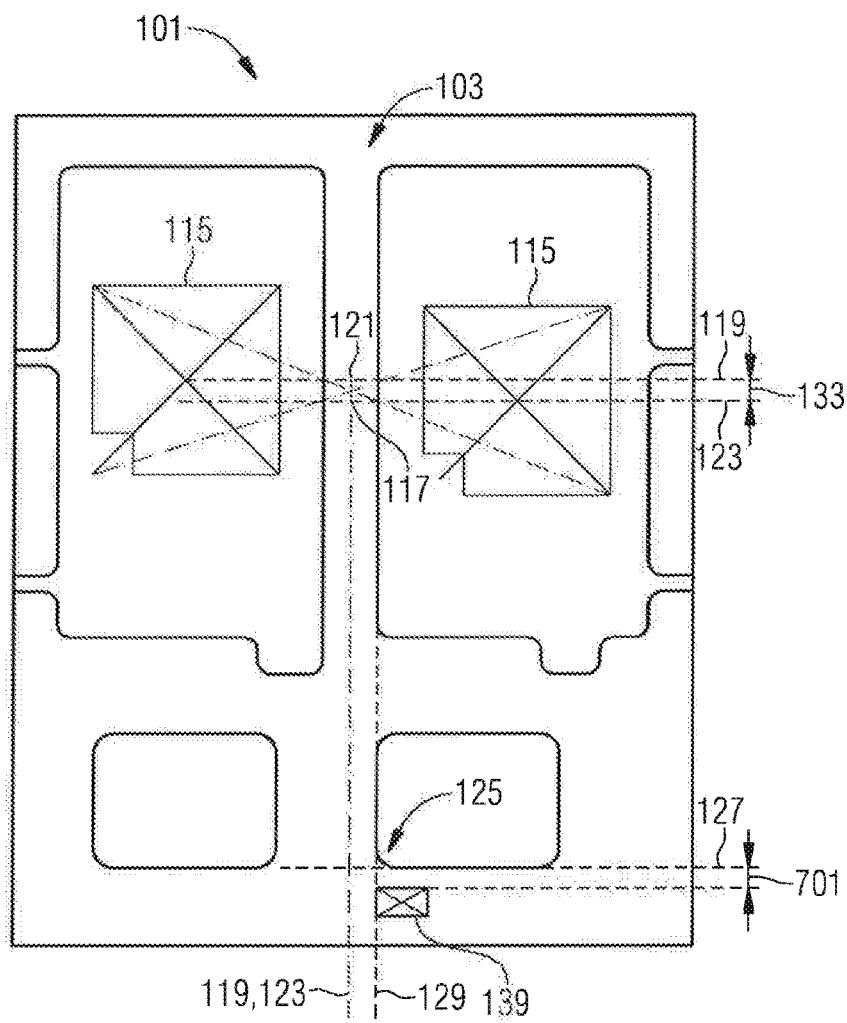

FIG. 7 shows a further optoelectronic component 101.

The marking 139 is offset by exactly the same offset or exactly the same deviation relative to the x-axis 127 in the y-direction which also corresponds to the deviation 133 in the y-direction. The offset is identified by the reference sign 701. In the example shown in accordance with FIG. 7, the lines 119 and 121 run one above another in the y-direction since there is no offset or deviation in the x-direction.

Figure 8:
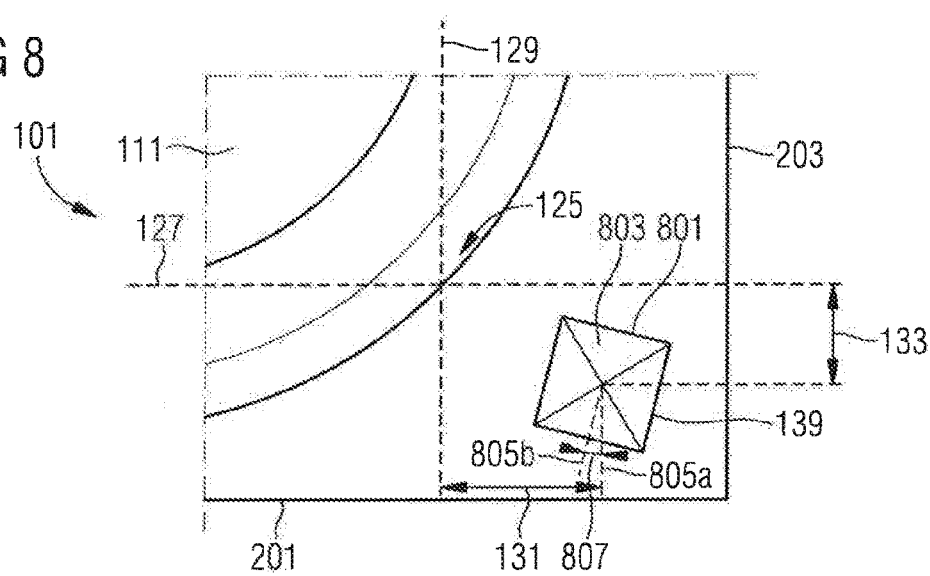

FIG. 8 shows a further optoelectronic component 101 in a partial view. That is to say, therefore, in particular that the optoelectronic component 101 is not shown in its entirety.

The marking 139 is formed by a square 801. The midpoint of the square 801 is identified by the reference sign 803.

The line bearing the reference sign 805a corresponds to the perpendicular upon alignment of the square 801 parallel to the outer edges 201, 203.

The line bearing the reference sign 805b corresponds to a perpendicular upon rotation of the square 801 about the midpoint 803 by a predefined angle 807.

It can thus be indicated in a simple manner by the marking 139 whether and to what extent the light source in the actual position 115 is rotated relative to the light source 103 in the desired position 113.

Figure 9:
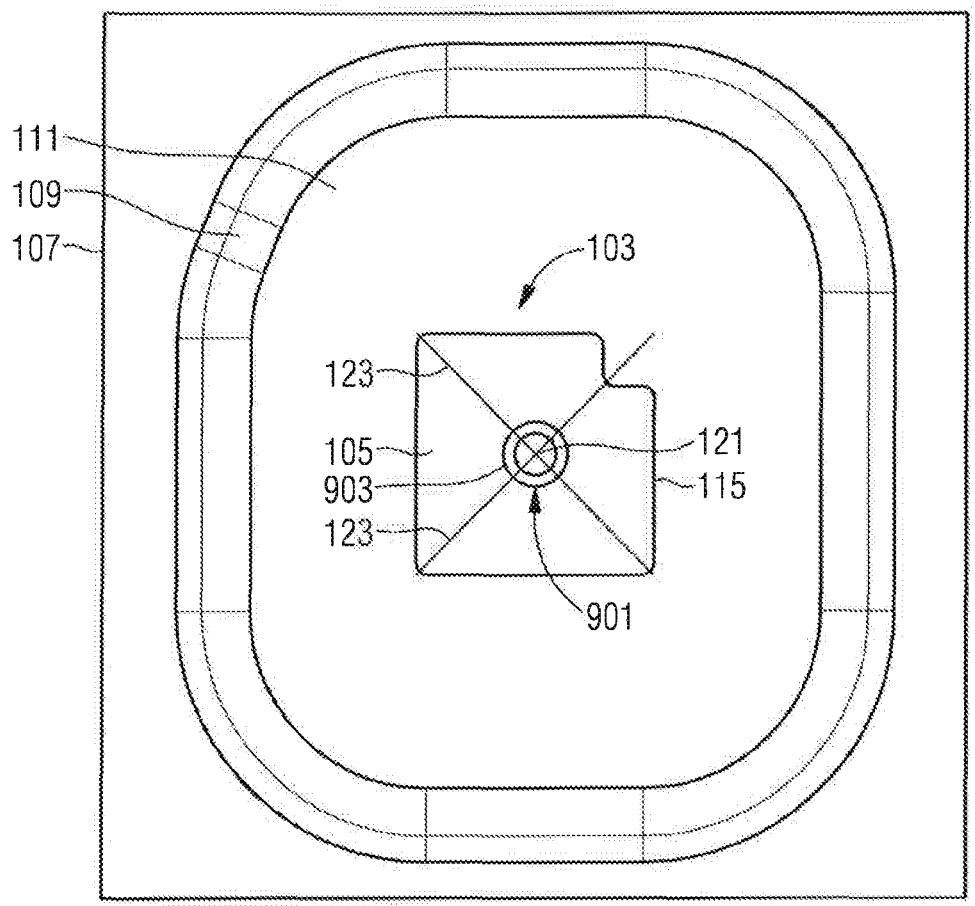

FIG. 9 shows a further optoelectronic component 101.

The optoelectronic component 101 has an actual marking 901 that indicates or marks the actual position 115 of the light source 103 or of the optical center 121. That is to say, therefore, in particular that the optical center 121 of the actual position 115 is identified by the actual marking 901 at the receptacle device 107, for example, at the housing 109 before the deviation is determined. The desired position is not shown for the sake of clarity.

The actual marking 901 is formed as a luminous marking 903. The luminous marking 903 is designed to emit electromagnetic radiation upon excitation by electromagnetic radiation having a first wavelength. In this case, the first wavelength differs from a second wavelength of electromagnetic radiation which can be emitted during operation by the light emitting diode or the light emitting diodes. The luminous marking 903 is formed as a ring, that is to say has a ring shape. The midpoint of the ring is the point of intersection of the intersecting lines 123, which is the optical center 121 of the actual position 115. Consequently, the midpoint of the ring indicates the optical center 121 of the actual position 115.

Consequently, in an advantageous manner, the luminous marking 903 is therefore not excited to emit light during operation of the optoelectronic component 101. To determine the deviation, the luminous marking 903 is irradiated with or exposed to electromagnetic radiation having a first wavelength. In this respect, the luminous marking 903 will then emit electromagnetic radiation. Consequently, the luminous marking 903 can therefore be captured or detected simply and reliably by a camera, in particular a video camera. By this means, a determination of the optical center 121 of the actual position 115 is therefore made possible in an advantageous manner. On the basis thereof, the deviation can then be determined. On the basis thereof, a marking indicating the deviation can then be attached to a rear side of the housing.

The optoelectronic component 101 may be soldered on a carrier, for example, on a printed circuit board. In this example with the carrier, it can be provided, for example, that the carrier, for example, the printed circuit board is arranged in particular adhesively bonded onto a desired position relative to the actual marking 901 in particular relative to the luminous marking 903 that is to say, for example, if the carrier with the optoelectronic component 101 is introduced into or arranged in an optical system.

The luminous marking 903 is formed as a ring in the example in accordance with FIG. 9. In examples not shown, the luminous marking can be formed as a circle, a cross, a square, a rectangle or any other geometry desired. The luminous marking 903 comprises a phosphorescent material, in particular.

FIGS. 10A and 10B show a further optoelectronic component 101.

FIG. 10A shows a rear view and FIG. 10B shows a front or plan view. The luminous marking 903 is arranged on the rear side of the housing 109 in the example in accordance with FIGS. 10A and 10B.

Figure 11:
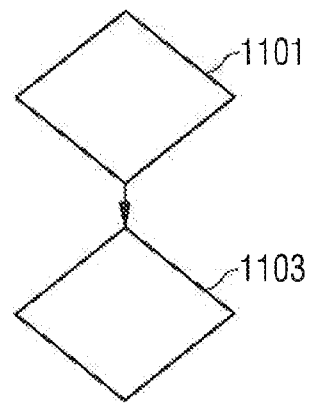
FIG. 11 shows a flow diagram of a method of processing an optoelectronic component.

FIG. 11 shows a flow diagram of a method of processing an optoelectronic component.

The component has a light source comprising at least one luminous area formed by one or a plurality of light emitting diodes, wherein the component has a receptacle device that receives the light source.

In accordance with a step 1101, a deviation of an actual position of the light source in the receptacle device from a desired position of the light source in the receptacle device is determined. In accordance with a step 1103, at least one marking indicating the deviation is formed at the receptacle device.

Figure 12:
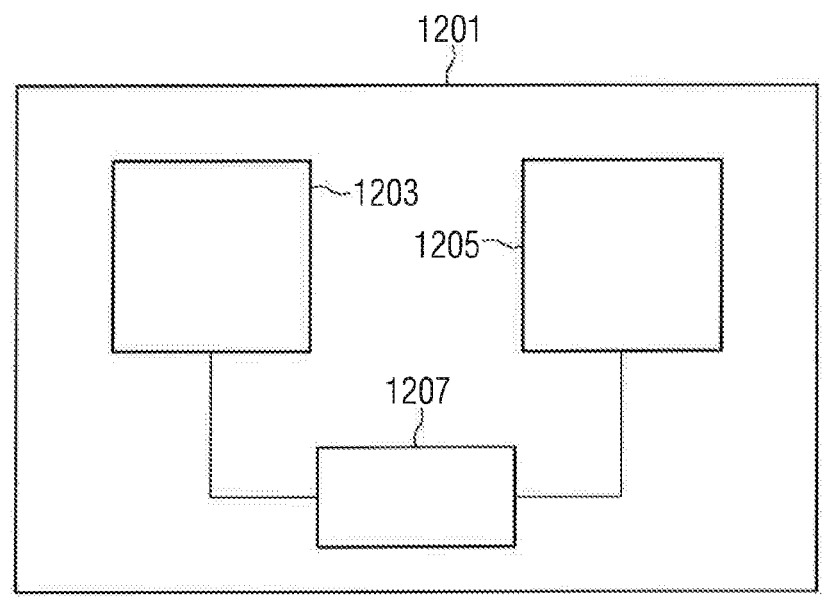
FIG. 12 shows a block diagram of an apparatus that processes an optoelectronic component.

FIG. 12 shows an apparatus 1201 that processes an optoelectronic component.

The optoelectronic component comprises a light source having at least one luminous area formed by one or a plurality of light emitting diodes, wherein the component comprises a receptacle device that receives the light source.

The apparatus 1201 comprises a deviation determining device that determines a deviation of an actual position of the light source at the receptacle device from a desired position of the light source at the receptacle device. Furthermore, the apparatus 1201 comprises a marking device 1205 that forms a marking of a receptacle device. Furthermore, the apparatus 1201 comprises a controller 1207 that controls the marking device depending on the determined deviation to form at least one marking indicating the deviation at the receptacle device.

The marking device can comprise, for example, a laser and/or a drill and/or a stamp. By the aforementioned elements, the marking can then correspondingly be attached or introduced at the receptacle device.

Figure 13:
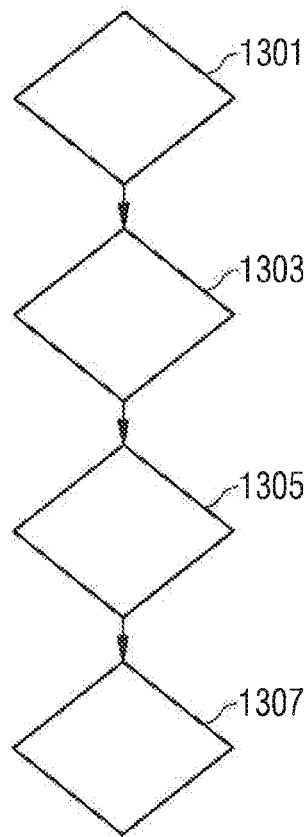
FIG. 13 shows a flow diagram of a method of equipping a carrier with an optoelectronic component.

FIG. 13 shows a flow diagram of a method of equipping a carrier, in particular an electronic circuit carrier, with a component.

A carrier is provided in accordance with a step 1301. The carrier has a first receptacle position to receive the optoelectronic component. That is to say therefore, for example, that the carrier has markings indicating the first receptacle position.

The marking of the optoelectronic component is detected to determine the deviation in accordance with a step 1303.

A second receptacle position on the carrier is determined, which is chosen depending on the determined deviation relative to the first receptacle position in accordance with a step 1305.

There follows a process of arranging the component on the carrier in the second receptacle position in a step 1307.

Figure 14:
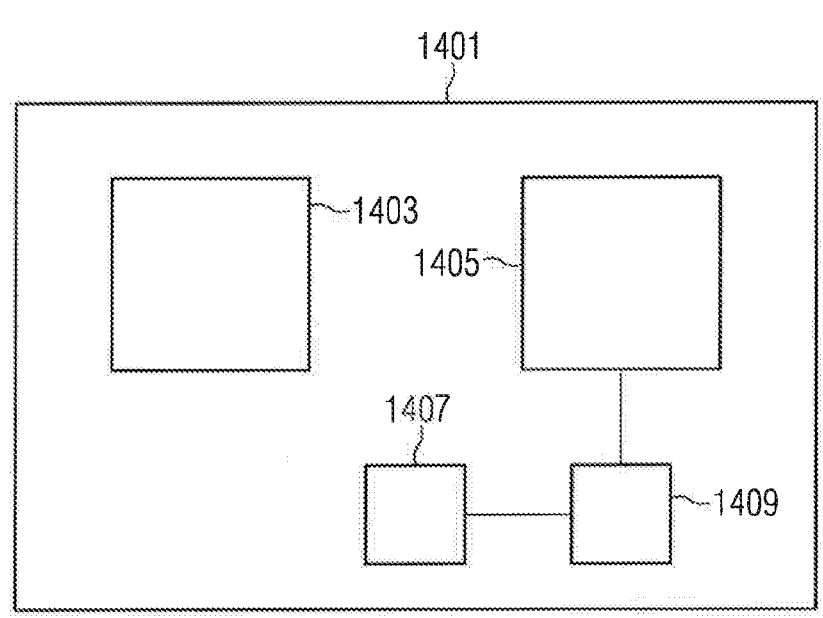
FIG. 14 shows a block diagram of an apparatus that equips a carrier.

FIG. 14 shows an apparatus 1401 that equips a carrier, in particular an electronic circuit carrier, with an optoelectronic component.

The apparatus 1401 comprises a providing device 1403 that provides a carrier with a first receptacle position to receive the optoelectronic component.

The apparatus 1401 furthermore comprises a detecting device 1405 that detects the marking to determine the deviation.

Furthermore, the apparatus 1401 comprises an arranging device 1407 that arranges the component on the carrier.

Furthermore, a controller 1409 can control the arranging device 1407, wherein the controller 1409 controls the arranging device 1407 such that the arranging device 1407 arranges the optoelectronic component in a second receptacle position, which is chosen depending on the determined deviation relative to the first receptacle position.

In an example not shown, arranging may comprise placing the component on the carrier, wherein, for example, during soldering of the placed component, the latter is held or fixed in the placed position or situation, for example, by adhesive bonding.

To summarize, we provide the concept of determining a deviation of an actual position of an optical center of a luminous area of an optoelectronic component with respect to a desired position and applying the deviation as a marking on a housing outer side, for example, a housing top side and/or housing underside and/or a lateral housing side.

Although our apparatuses and methods have been more specifically illustrated and described in detail by the preferred examples, nevertheless this disclosure is not restricted by the examples disclosed and other variations can be derived therefrom by those skilled in the art, without departing from the scope of protection of the appended claims.

This application claims priority of DE 10 2013 219 087.5, the subject matter of which is incorporated by reference.

The invention claimed is:

1. A method of processing an optoelectronic component comprising a light source having at least one luminous area formed by one or a plurality of light emitting diodes and a receptacle device that receives the light source, comprising:
   determining a deviation of an actual position of the light source at the receptacle device from a desired position of the light source at the receptacle device, and
   forming at least one marking at the receptacle device that indicates the deviation,
   wherein an optical center of the luminous area is determined and the marking indicates the deviation of the actual position of the optical center with respect to a desired position of the optical center.

2. The method as claimed in claim 1, wherein a reference co-ordinate system is determined at the receptacle device and the marking indicates the deviation of the actual position with respect to a desired position relative to the reference co-ordinate system.

3. The method as claimed in claim 1, wherein the marking is implemented at the receptacle device by at least one of notching, drilling or embossing.

4. The method as claimed in claim 1, wherein the marking is formed as a barcode.

5. A method of processing an optoelectronic component comprising a light source having at least one luminous area formed by one or a plurality of light emitting diodes and a receptacle device that receives the light source, comprising:
   determining a deviation of an actual position of the light source at the receptacle device from a desired position of the light source at the receptacle device, and
   forming at least one marking at the receptacle device that indicates the deviation, wherein the receptacle device has a housing, the light source being arranged in said housing, and the marking is applied on a housing outer side facing away from the light source.

6. A method of processing an optoelectronic component comprising a light source having at least one luminous area formed by one or a plurality of light emitting diodes and a receptacle device that receives the light source, comprising:
   determining a deviation of an actual position of the light source at the receptacle device from a desired position of the light source at the receptacle device, and
   forming at least one marking at the receptacle device that indicates the deviation, wherein a reference co-ordinate system is determined at the receptacle device and the marking indicates the deviation of the actual position with respect to a desired position relative to the reference co-ordinate system.

7. The method as claimed in claim 6, wherein an optical center of the luminous area is determined and the marking indicates the deviation of the actual position of the optical center with respect to a desired position of the optical center.

8. The method as claimed in claim 6, wherein at least one physical feature of the receptacle device is detected as a reference feature and used to determine the reference co-ordinate system.

9. The method as claimed in claim 6, wherein at least one physical feature of the receptacle device is detected as a reference feature and used to determine the reference co-ordinate system, the receptacle device has a housing as a physical feature, the light source being arranged in said housing, and a housing edge is detected for the purpose of determining a coordinate axis of the reference co-ordinate system such that the coordinate axis runs at least partly along the housing edge.

10. The method as claimed in claim 6, wherein at least one physical feature of the receptacle device is detected as a reference feature and used to determine the reference co-ordinate system, the receptacle device has a cutout as a physical feature, and an edge of the cutout is detected for the purpose of determining a coordinate axis of the reference co-ordinate system such that the coordinate axis runs at least partly along the edge.

11. A method of processing an optoelectronic component comprising a light source having at least one luminous area formed by one or a plurality of light emitting diodes and a receptacle device that receives the light source, comprising:
   determining a deviation of an actual position of the light source at the receptacle device from a desired position of the light source at the receptacle device, and
   forming at least one marking at the receptacle device that indicates the deviation, wherein, prior to determining the deviation, the actual position is identified by an actual marking at the receptacle device, wherein
   the actual marking is formed as a luminous marking that emits electromagnetic radiation upon excitation by electromagnetic radiation having a first wavelength, and the first wavelength differs from a second wavelength of electromagnetic radiation emitted during operation by the light emitting diode.

12. The method as claimed in claim 11, wherein an optical center of the luminous area is determined and the marking indicates the deviation of the actual position of the optical center with respect to a desired position of the optical center.

13. The method as claimed in claim 11, wherein a reference co-ordinate system is determined at the receptacle device and the marking indicates the deviation of the actual position with respect to a desired position relative to the reference co-ordinate system.

14. The method as claimed in claim 5, wherein the marking is implemented at the receptacle device by at least one of notching, drilling or embossing.

15. The method as claimed in claim 5, wherein the marking is formed as a barcode.

\* \* \* \* \*